United States Patent [19]
Nering et al.

[11] Patent Number: 6,082,951
[45] Date of Patent: Jul. 4, 2000

[54] WAFER CASSETTE LOAD STATION

[75] Inventors: Eric A. Nering, Modesto; Ilya Perlov; Eugene Gantvarg, both of Santa Clara; Victor Belitsky, Sunnyvale, all of Calif.

[73] Assignee: Applied Materials, Inc., Santa Clara, Calif.

[21] Appl. No.: 09/012,323

[22] Filed: Jan. 23, 1998

[51] Int. Cl.[7] .................................................. B65G 49/07
[52] U.S. Cl. ...................... 414/217.1; 414/416; 414/937; 414/939
[58] Field of Search ..................................... 414/217, 411, 414/416, 937, 939, 940, 805, 811, 217.1; 198/346.1; 248/500

[56] References Cited

U.S. PATENT DOCUMENTS

| | | | |
|---|---|---|---|
| 4,776,744 | 10/1988 | Stonestreet et al. | 414/937 X |
| 4,917,556 | 4/1990 | Stark et al. | 414/939 X |
| 4,954,721 | 9/1990 | Suzuki | 414/940 X |
| 5,525,024 | 6/1996 | Freerks et al. | 414/416 |
| 5,586,585 | 12/1996 | Bonora et al. | 414/940 X |
| 5,607,276 | 3/1997 | Muka et al. | 414/940 X |
| 5,609,689 | 3/1997 | Kato et al. | 414/939 X |
| 5,613,821 | 3/1997 | Muka et al. | 414/939 X |
| 5,664,926 | 9/1997 | Sussman et al. | 414/940 X |
| 5,713,711 | 2/1998 | McKenna et al. | 414/940 X |
| 5,772,386 | 6/1998 | Mages et al. | 414/940 X |
| 5,810,537 | 9/1998 | Briner et al. | 414/939 X |
| 5,829,939 | 11/1998 | Iwai et al. | 414/940 X |

FOREIGN PATENT DOCUMENTS 0 735 573  2/1996  European Pat. Off. .

*Primary Examiner*—Gregory A. Morse
*Attorney, Agent, or Firm*—Thomason, Moser & Patterson

[57] ABSTRACT

A pod loading station and method of operation are provided for enabling the transfer and introduction of wafers into a processing system from a wafer pod. The pod loading station generally includes a movable receiving platform for supporting a wafer pod and a movable pod door receiver having a pod door latch actuating mechanism disposed thereon. The movable platform supports a wafer pod, moves the wafer pod into engagement with the pod door receiver, and then retracts to enable the door supported by the door receiver to be removed from the opening of the pod. The pod door receiver then lowers the pod door below the pod to enable access to the pod opening.

26 Claims, 16 Drawing Sheets

WAFER CASSETTE LOAD STATION

BACKGROUND OF THE INVENTION

1. Field of the Invention

The present invention relates to an apparatus and method for loading wafers into a processing system. More particularly, the invention relates to a method and apparatus for accessing a wafer pod or cassette so that wafers can be moved between the wafer pod and the processing system.

2. Background of the Related Art

The fabrication of electronic devices on substrates is typically performed in processing systems. Processing systems take on various configurations including single wafer systems where a single wafer is processed in a processing chamber and batch type systems where multiple wafers are processed in a chamber. Despite system architecture disparities, substrates are delivered to the processing systems from a clean room using standardized interfaces and wafer pods or cassettes. A human operator or factory automation delivers multiple wafers loaded in wafer pods or cassettes to a loading mechanism which transfers the wafers from the clean room in a fabrication facility into the processing system without exposing the wafers to contaminants. The delivery of wafers between processing systems and the operation of pod doors has been standardized by an organization known as SEMI.

Recent advances in circuit design and processing technology have driven a significant decrease in the size of semiconductor devices. At the same time, chip makers are trying to increase the number of devices which can be produced on a single wafer. Accordingly, wafer sizes have increased to 300 mm, thereby requiring larger systems which increase the amount of fabrication facility floor space required to house the larger systems. Also, as the wafer size has increased, the handling of wafers has become more limited to factory automation, instead of manual handling, to accommodate the increase in size and weight of wafer pods.

FIG. 1 is a schematic top view of a representative processing system 10 having a front-end staging area 12 which mounts a plurality of wafer pod loading stations 14 through an interface wall 16 separating the clean room 18 from the gray area 20 where the processing system 10 is housed. A single wafer processing system may include one or more load lock chambers 22, a central transfer chamber 24 and a plurality of processing chambers 26 mounted on the transfer chamber.

A robot 28 disposed in the front-end staging area 12 moves wafers from wafer pods disposed on the pod loading stations 14 into a load lock chamber 22. A robot 30 disposed in the transfer chamber 24 moves wafers from a load lock chamber 22 into a processing chamber 26. The pod loading stations 14 are disposed through an opening in the interface wall 16 and provide a movable door opener 32 which seals the opening in the interface wall 16 when a wafer pod is not positioned on the pod loading station 14.

There are several commercial pod loading stations available from manufacturers such as Jenoptik/INFAB, ASYST, PRI Automation and DYFUKU. These pod loading stations are very similar in function and appearance as they are all designed to meet applicable SEMI standards for the interface to the processing system as well as the interface to the pod and the pod loading station as presented to the fabrication facility material transport system (AGV, OHT, PGV). These current designs share the following details: a mechanical interface to receive a pod using three pins as required by SEMI; a mechanism to latch the pod into place on the pod loader; a mechanism to grip a pod door and operate the pod door latch mechanism; and, a mechanism to remove the pod door and store the door out of the way of the pod opening to allow clear access to the wafers stored inside the pod. These existing designs all employ a mechanical motion which latches the pod to a fixed position, grips and unlatches the pod door, pulls the pod door horizontally away from the pod (i.e., into the staging area 12), and then lowers the pod door below the plane of the pod for storage of the door while allowing access to all wafer positions.

The pod loading stations 14 are designed so that an operator or factory automation can deliver a wafer pod onto the pod loading station and the wafers can be unloaded into the processing system. FIG. 2 is a schematic side view of a pod loading station 14 illustrating the state of the art prior to the present invention. The loading station typically includes a pod receiving platform 40 which is movable in a horizontal plane to receive a pod 60 in a first position away from the interface wall 16 and then move the pod into a loading/unloading position adjacent the interface wall. The wafer pods have a door which includes a locking mechanism to secure the door in place in the pod for transit within the fabrication facility. The locking mechanism is standardized as required by SEMI and includes two rotating latches to secure the door in a locked position. The pod loading stations 14 include a door opening mechanism 42 which engages and operates the locking mechanisms of the door and then opens the door when the wafer pod is in the loading/unloading position. The door opening mechanism 42 presently used is disposed in the front-end staging area 12 and moves the door horizontally away from the wafer pod along arrow A until the door clears the pod opening and then vertically downward along arrow B until the pod opening is cleared enabling horizontal access to wafers in the pod. Both the location of the door opener 42 and the horizontal motion required to remove the door consume additional floor space in the front-end staging area, thereby increasing the overall footprint of the system.

Each of the pod loading stations currently in use require both the horizontal and vertical movement of the door in order to open the pod. This type of mechanism requires a clearance space or envelope within the front-end staging area 12 to enable the pod door to be opened which adds a significant cost to the facility in terms of floor space required for a system. Additionally, the initial movement of the door opening mechanism is a hinged movement which causes some frictional contact between the pod door and the pod opening. It would be desirable if the pod loading station would open pod doors with minimal friction and using simple actuator motions.

Therefore, there is a need for a pod loading station which occupies minimal floor space and utilizes fewer movements than currently available designs.

SUMMARY OF THE INVENTION

The invention generally provides a pod loading station having a door opening mechanism and a method of opening a pod door. In one embodiment, the pod loader utilizes the translational movement of the wafer pod on the pod loading station to remove the pod door from the pod opening and the vertical movement of a pod door receiver to move the door below the pod opening. The pod loading station includes two actuators, preferably stepper or servo motors, to move the wafer pod into a pod door receiver where the pod door is held and the pod door latches are actuated. The wafer pod is then retracted away from the pod door receiver which holds the pod door to provide clearance between the pod door and the pod opening. The pod door receiver is then lowered along with the pod door below the pod opening to enable access into the wafer pod. The pod door receiver can include a secondary door which provides additional isolation for the wafer pod environment when the pod door is removed.

In another embodiment, the pod door receiver may include optical sensors such as a wafer mapper disposed thereon to enable wafer mapping within the cassette or pod as the pod door receiver moves downwardly. Providing these optical sensors on the pod door receiver enables a shorter focal length to be maintained than is possible with optical sensors disposed on robots used to load and unload wafer pods. Furthermore, these optical sensors on the pod door receiver allow the robots to be dedicated to wafer transfer and not wafer mapping or other tasks.

DETAILED DESCRIPTION OF A PREFERRED EMBODIMENT

Figure 1:
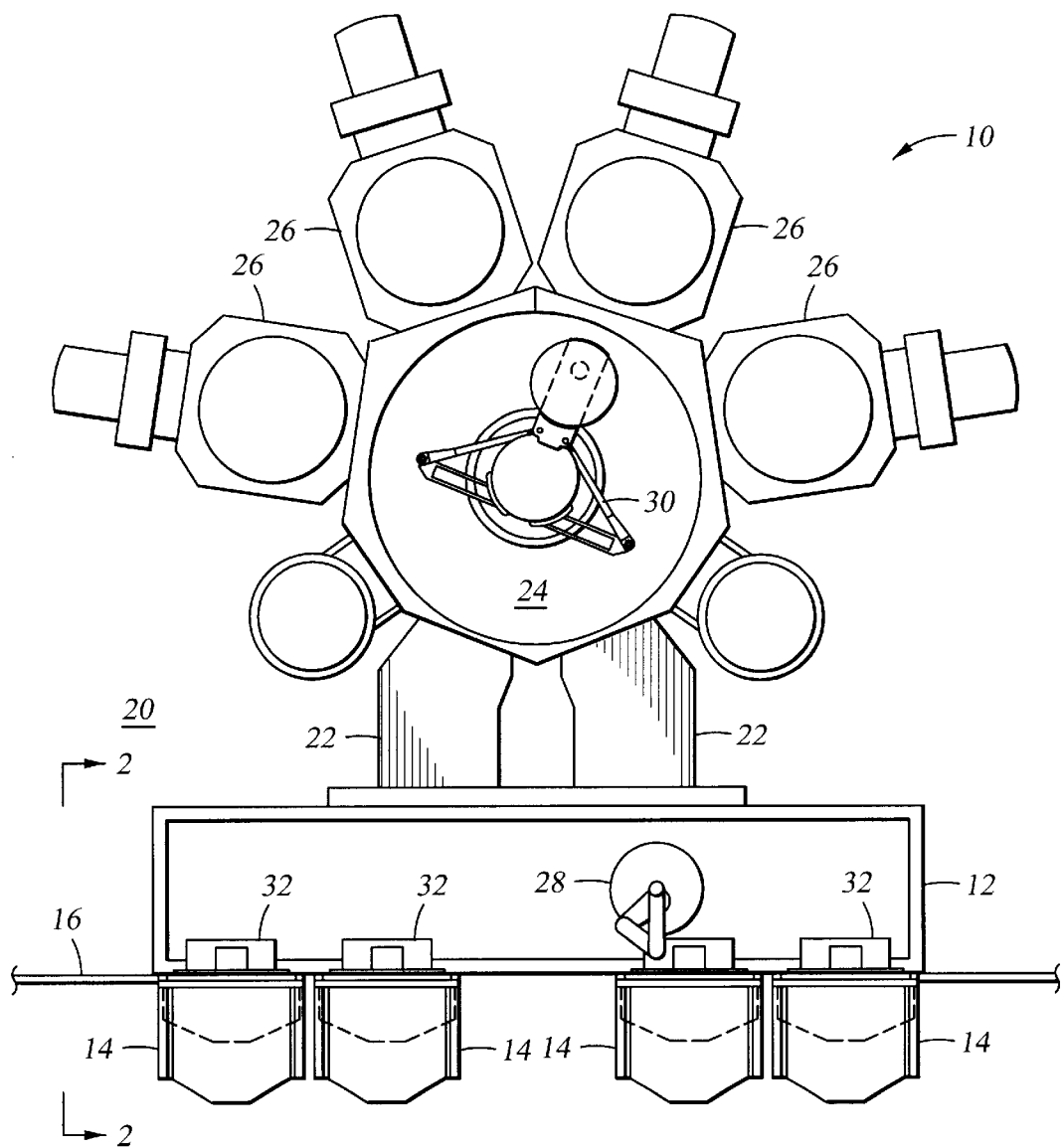
FIG. 1 is a plan view of the interface between a clean room and the gray area where a processing system is housed.
Figure 2:
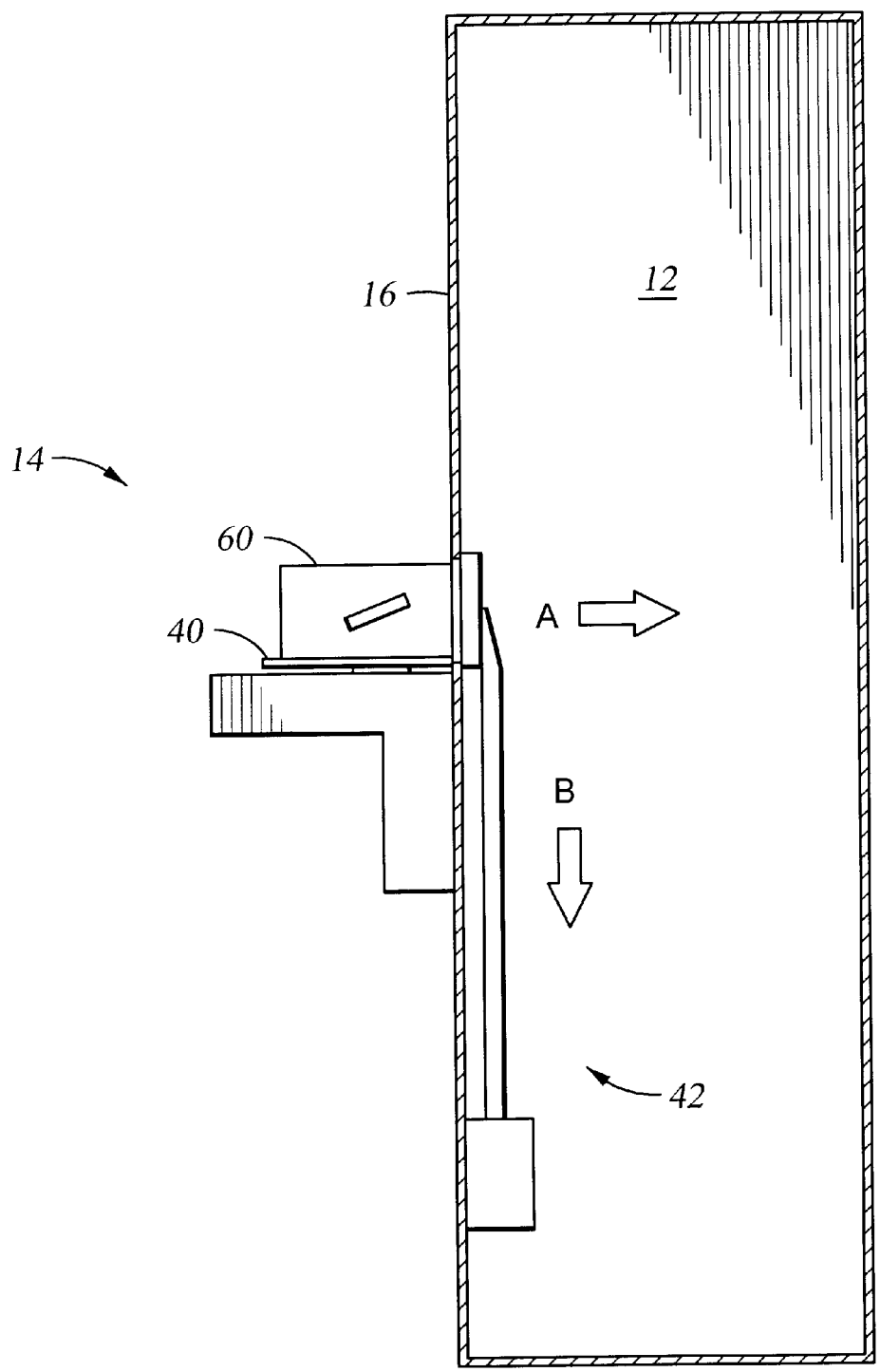
FIG. 2 is a perspective view of an exemplary prior art pod door opening apparatus.
Figure 3:
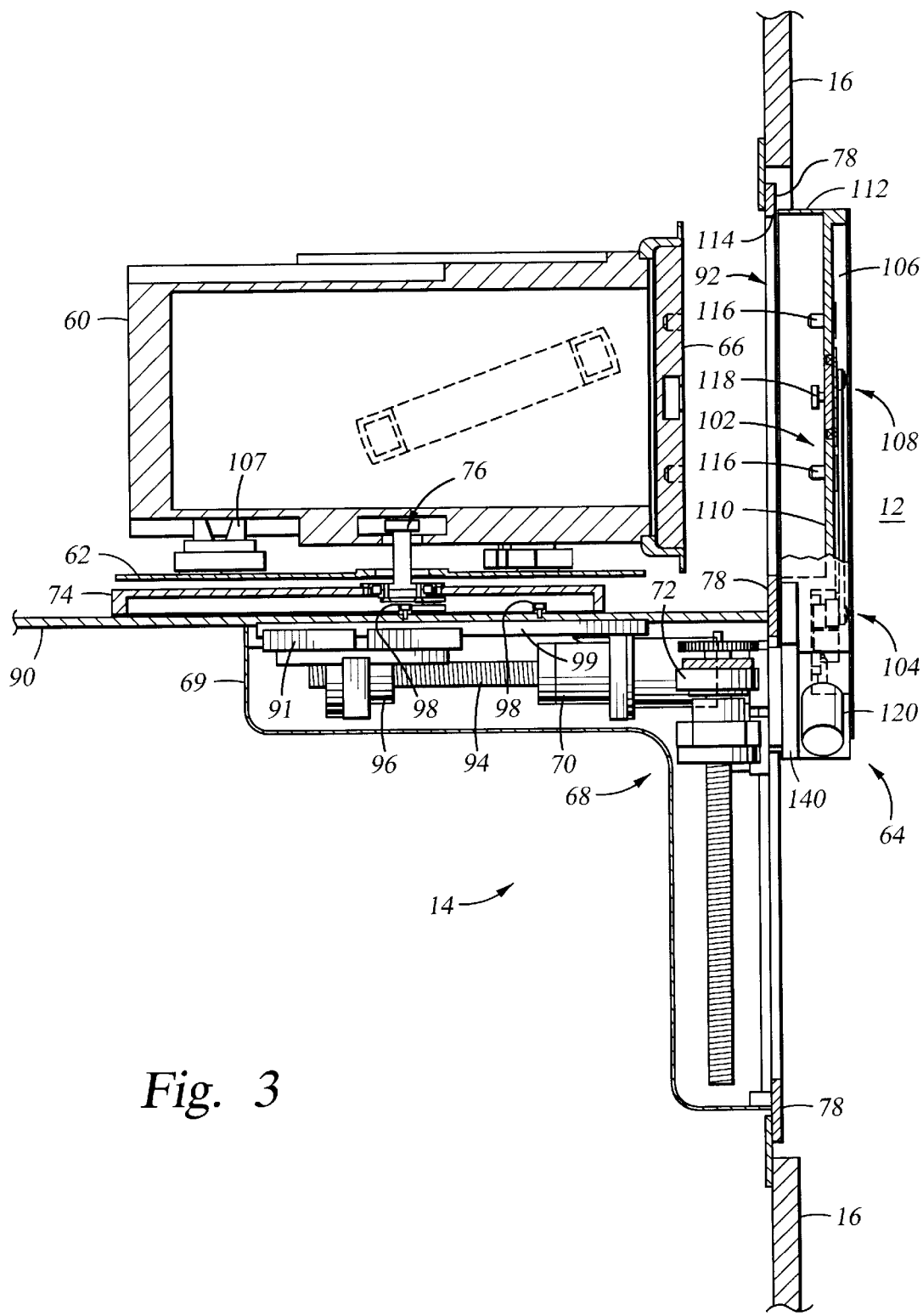
FIG. 3 is a cross sectional view of one pod loading station of the present invention shown in the loading/unloading position.

FIG. 3 is a cross sectional view of a pod loading station 14 of the invention having a wafer pod 60 disposed thereon. As used herein, the term pod refers to any container which holds one or more workpieces therein. The pod loading station generally includes a base plate 90 and an interface plate 78 which support a pod receiving platform 62 for supporting a wafer pod and a pod door opening mechanism 64 to engage and lower the pod door 66. An enclosure 68 defined by the base plate, the lower portion of the interface plate 78 and a cover 69 houses two actuators 70, 72 which are mounted to the base plate and the interface plate and which move the pod receiving platform 62 and the pod door opening mechanism 64 respectively. The interface plate 78 defines an opening 92 through which the wafer pod 60 moves to engage the door opening mechanism 64.

The receiving platform 62 is mounted on a translating platform 74 which is connected to the first actuator 70. The first actuator 70 which moves the translating platform 74 is disposed below and mounted to the base plate 90. The actuator shown in this embodiment is a stepper motor having a threaded rod 94 on which a nut 96 is disposed. However, other actuators such as servo motors, other electric or gas driven motors can be used. The nut 96 is connected to a beam 98 which mounts the translating platform 74. The actuator 70 preferably includes a setting for at least three stop positions so that translation of the wafer pod can be used to disengage the pod from the pod door and create a vertical clearance to allow the pod door to be lowered below the pod opening.

Figure 4:
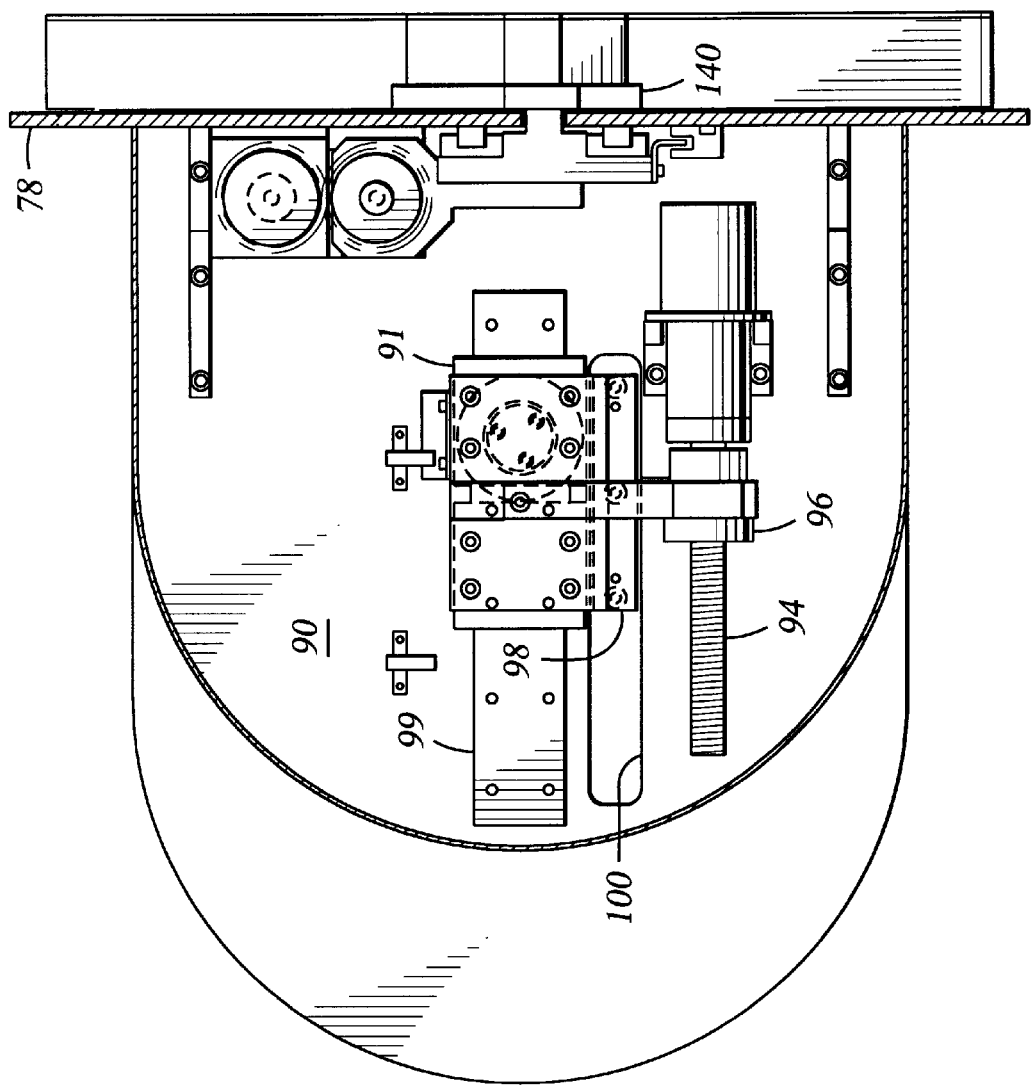
FIG. 4 is a bottom view of a pod loading station showing the horizontal actuating mechanism.

FIG. 4 is a bottom view of the actuating mechanism which moves the receiving platform 62 horizontally towards and away from the interface plate 78. A linear guide 99 is disposed on the bottom of the base plate 90 to mount a slide member 91 which is connected to the nut 96 and the beam 98 to provide precise linear movement of the receiving plate 62 above the base plate 90. The beam 98 is disposed at least partially through a channel 100 formed in the base plate 90 to mount the translating platform 74.

Figure 5A:
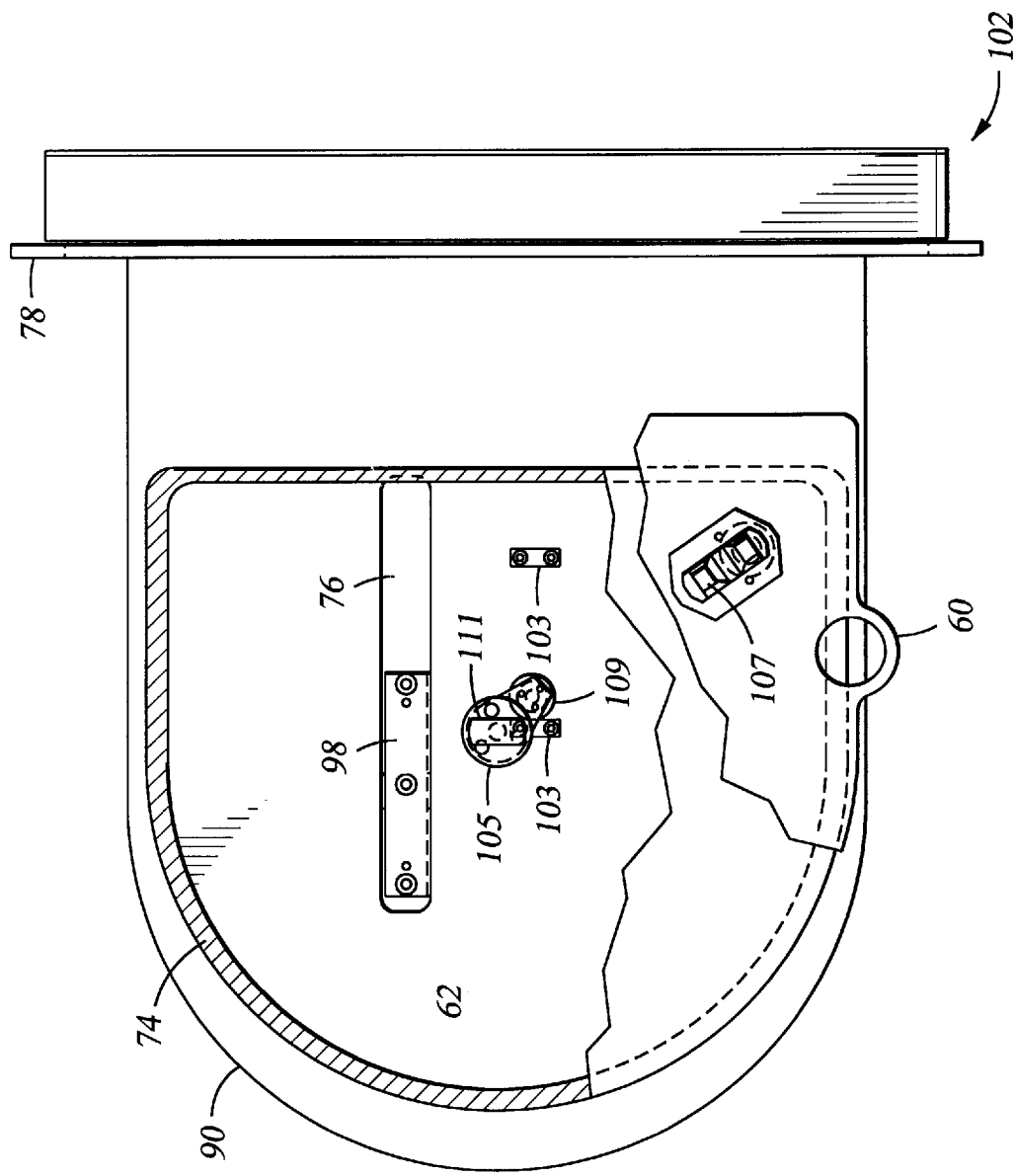
FIGS. 5a and 5b are top views of a pod loading station showing a latching mechanism to hold the pod on the pod loading station.
Figure 5B:
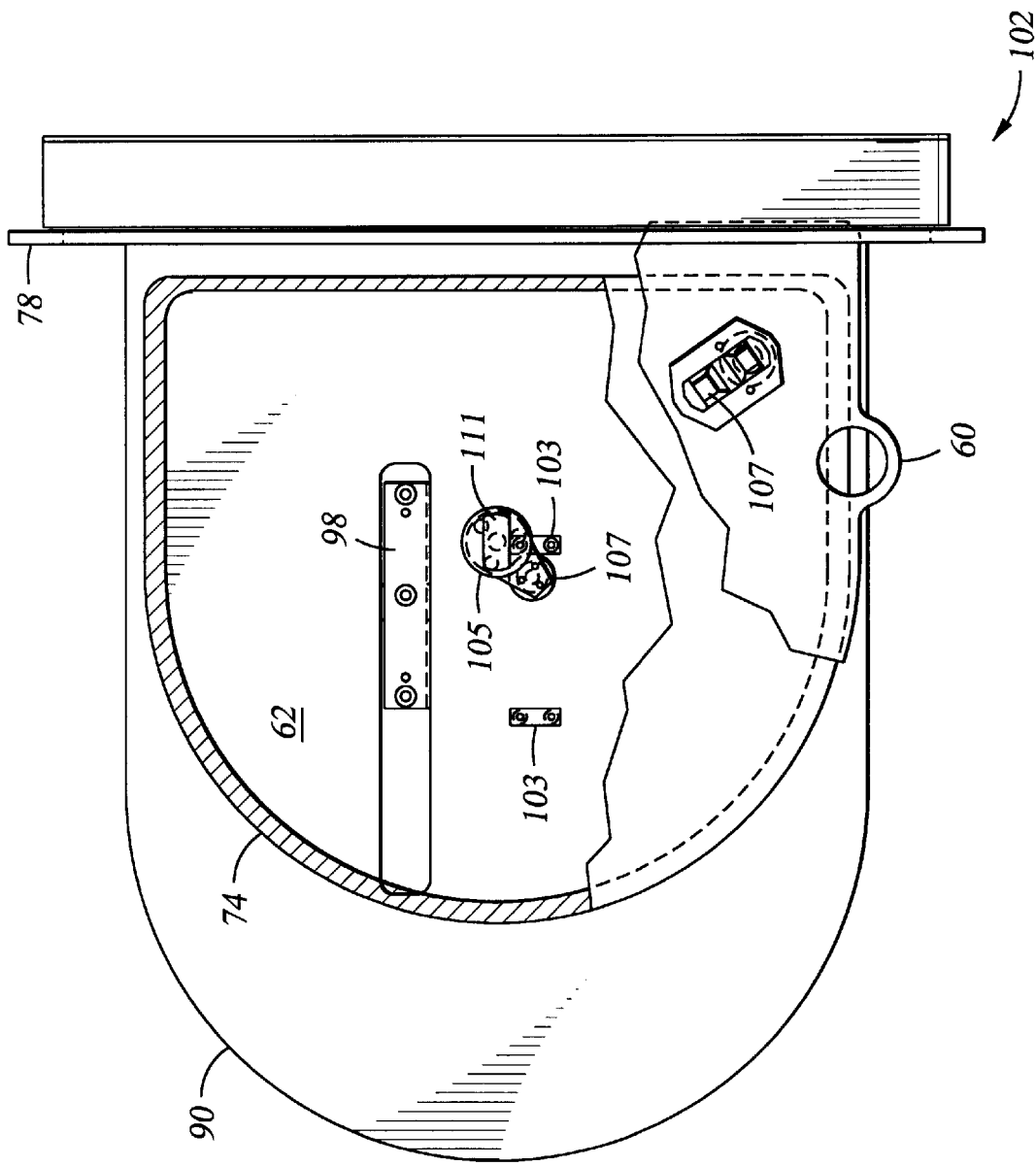

FIG. 5a is top view of a lock mechanism 76 which secures the pod 60 to the receiving platform 62 when the pod is moved towards the interface plate 78 where the door opener is engaged. This locking mechanism prevents the pod from being removed from the receiving platform 62 during operation, e.g., when the pod door has been removed. Two stops 103 are disposed on the base plate 90 and extend upwardly towards the translating platform 74. The translating platform includes a cam 105 having a detente 109 attached thereto to engage the stops 103 on movement of the translating platform 74. When the detente engages the stops, the cam rotates thereby rotating a key 111 which is received in the bottom of the pod. The two stops 103 are disposed on the base plate 90 in a spaced relationship to define a travel range during which locking and unlocking of the pod can occur. FIG. 5a shows the mechanism in the unlocked position for loading and unloading of pods. FIG. 5b shows the lock mechanism in the locked position once the translating platform 74 has been moved forward towards the interface plate 78.

Figure 6:
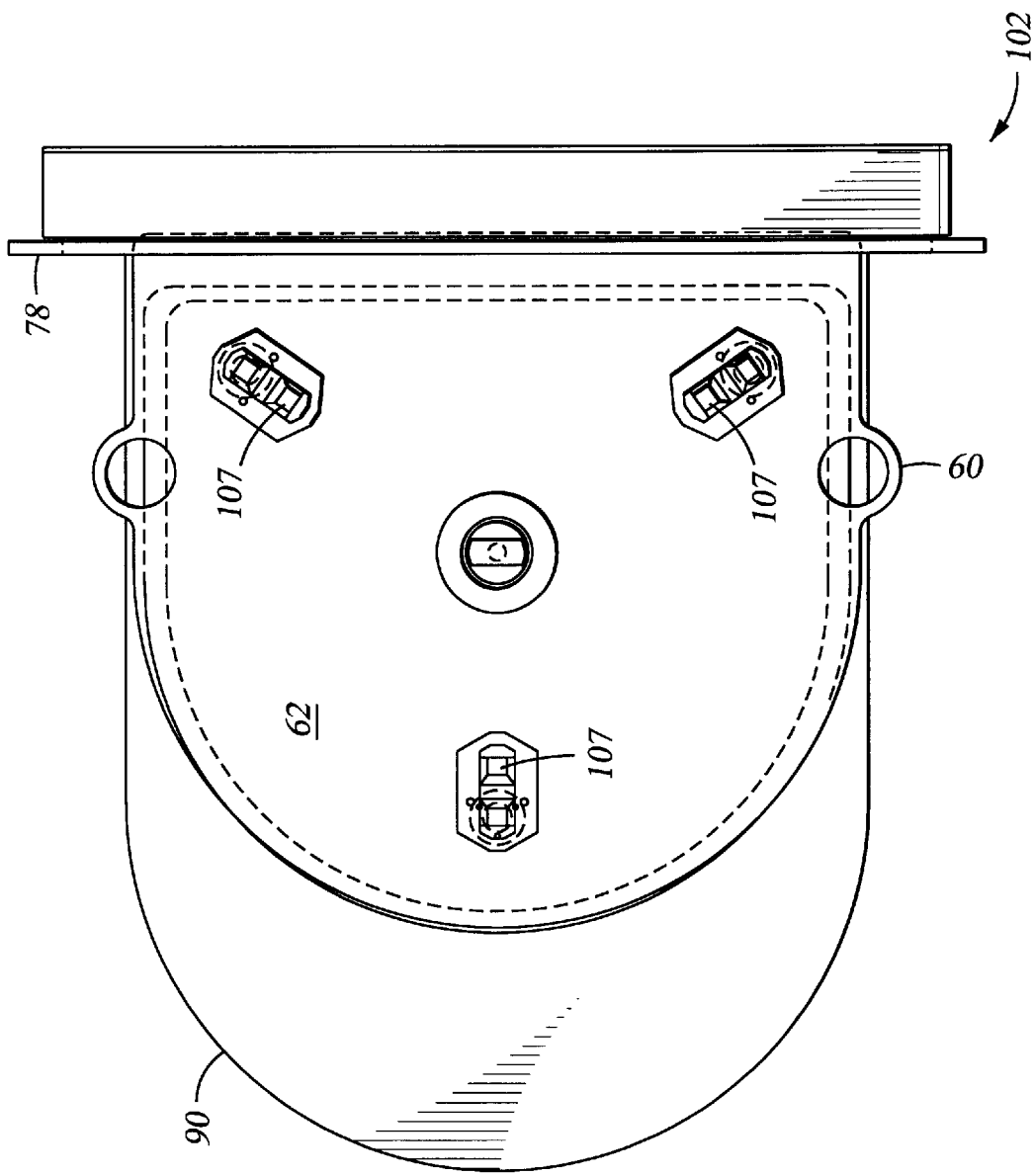
FIG. 6 is a top view of a loading station showing the pod alignment pins.

FIG. 6 is a top view of the receiving platform 62 showing three alignment pins 107 which align the wafer pod on receipt from a human operator or factory automation and support the wafer pod above the plane of the receiving platform 62 as required by the SEMI standards. A required clearance between the wafer pod and the receiving platform allows the fabrication facility to employ ground transfer automation which supports the wafer pod on its bottom surface as well as overhead automation to deliver the wafer pods.

Referring again to FIG. 3, the door opening mechanism 64 generally includes a pod door receiver or holder 102, a pod door latch actuating mechanism 104 and an actuator 72 to move the pod door receiver up and down. The pod door receiver 102 includes an upper portion for receiving the pod door 66 and a lower portion for mounting the door latch actuating mechanism 104 and connecting the door opener to the actuator 72. The upper portion defines a recess 106 into which the pod door is received and two latch actuating mechanisms 108 to engage and operate the pod door latches. The recess is defined by a base plate 110 and a circumferential wall 112 sized to close encompass the perimeter of a wafer pod. The circumferential wall 112 is sized to enable the wafer pod to be at least partially received therein while defining a narrow gap 114 between its outer edge and the interface plate 78 when the pod door receiver is in position to receive the wafer pod.

The base 110 of the recess includes two door latch actuating mechanisms 108 to engage and operate the door latches on the pod. One or more alignment pins 116 are also provided on the base 110 to assist in aligning the pod door 66 within the recess 106 as it is received therein. Both the configuration of the door latching mechanism and the alignment pins are determined by the SEMI standards for wafer pods. Each of the door latch actuating mechanisms includes a key 118 rotatably mounted in the base of the pod door receiver.

Figure 7A:
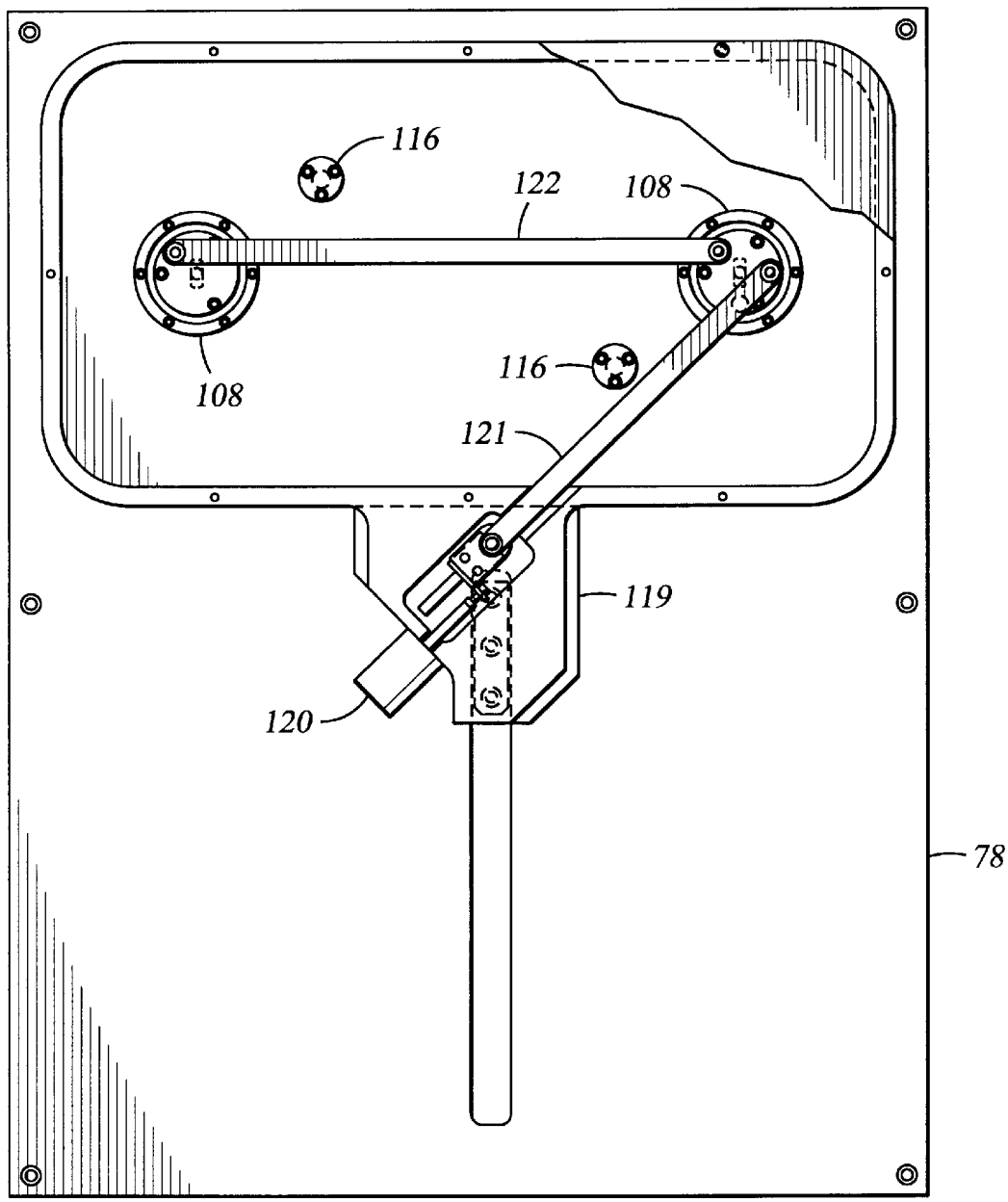
FIGS. 7a and 7b are front views of a pod door opener showing the pod door latching mechanism.
Figure 7B:
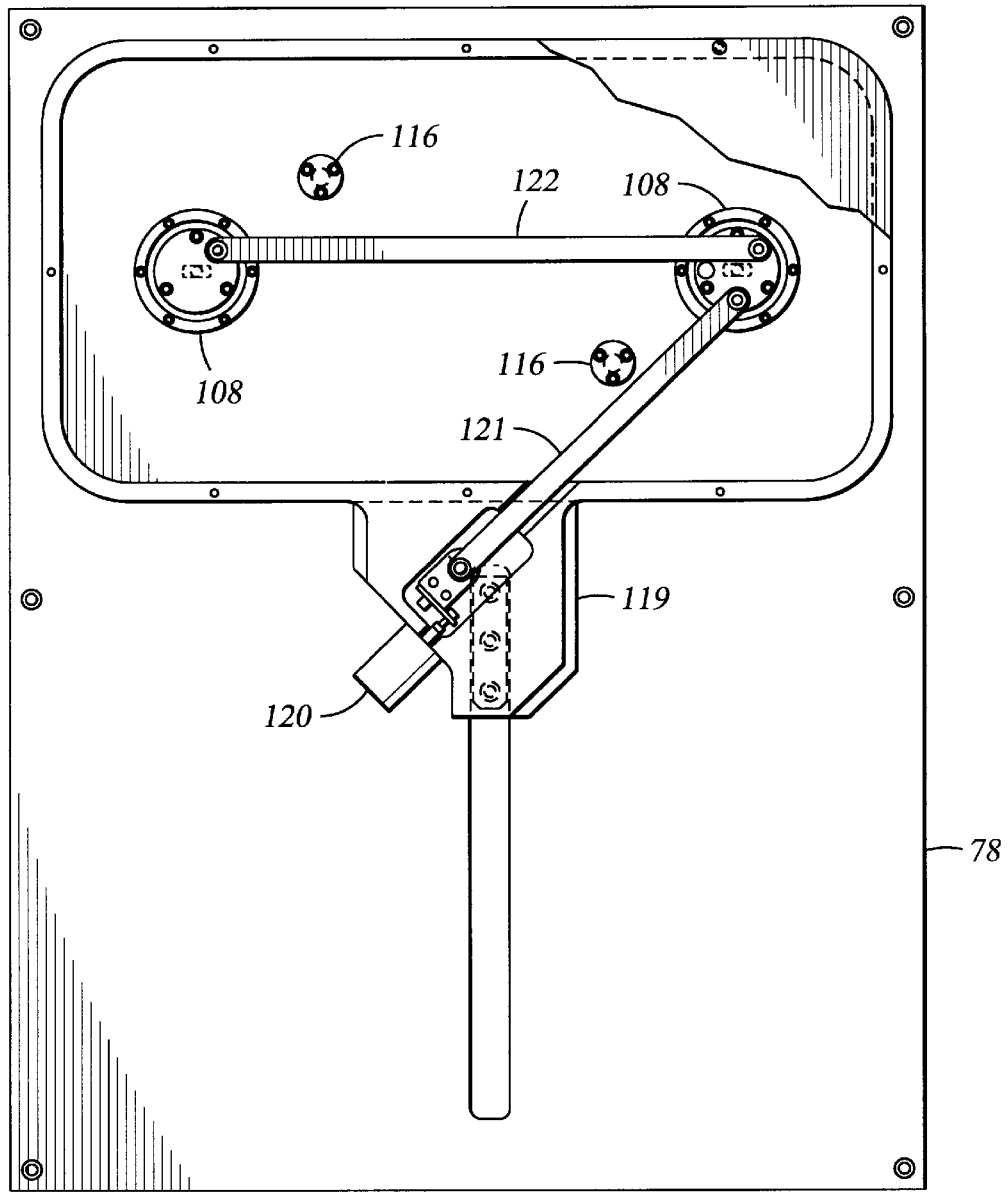

FIGS. 7a and 7b are front views of the pod door receiver showing the latch actuating mechanism of the pod door receiver. An actuator 120, such as a pneumatic cylinder or other gas or electric actuator, is mounted on the pod door receiver and connected to at least one of the door latching mechanisms 108 by a rod 121. Preferably, the two door latching mechanisms are connected either by a tie rod 122 or a belt assembly so that rotation of one latching mechanism 108 causes synchronized rotation of the second mechanism. However, independent actuators or other linking mechanisms can be employed to operate the door latches. The actuator 120 is mounted on the lower portion of the pod door receiver on the connecting plate 119. FIG. 7a shows the latching mechanisms 108 in the locked position. On actuation of the actuator 120, the latching mechanisms rotate clockwise as shown in FIG. 7b.

Figure 8:
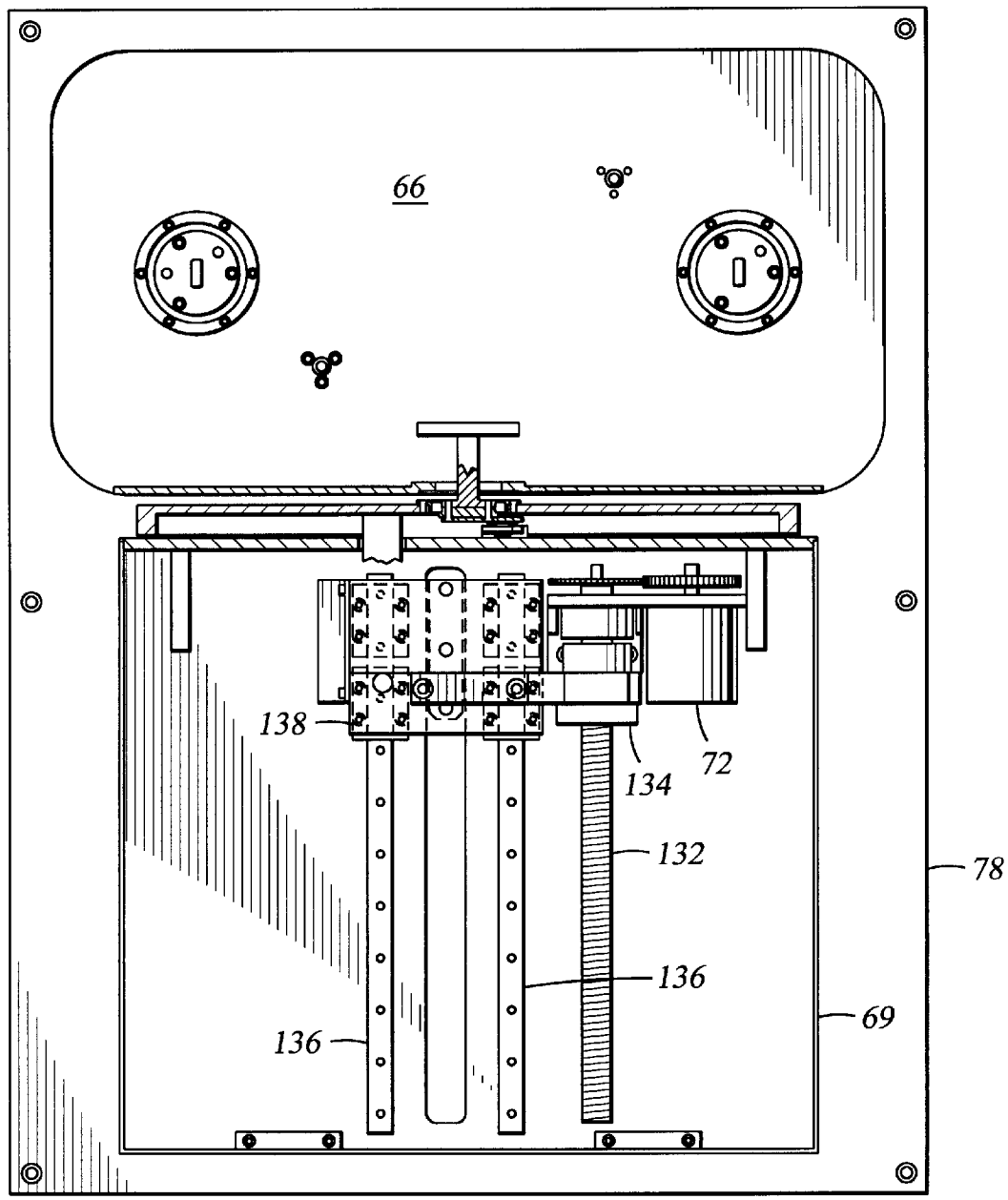
FIG. 8 is front view of a pod door opener showing the pod door actuating mechanism.

FIG. 8 is a front view of the actuating mechanism which moves the pod door receiver vertically after a pod door is received therein. A stepper motor 72 is mounted on the interface plate 78 below the base plate 90 and drives a threaded rod 132 and nut 134 disposed thereon to impart vertical motion to the pod door receiver as the threaded rod is rotated. A pair of linear guides 136 are also mounted on the interface plate 78 and support a slide plate 138 on which a mounting plate 140 (shown in FIG. 4) is connected. The mounting plate mounts the pod door receiver. The actuator is preferably a stepper or servo motor, but can be any gas, electric or other actuator.

Figure 9:
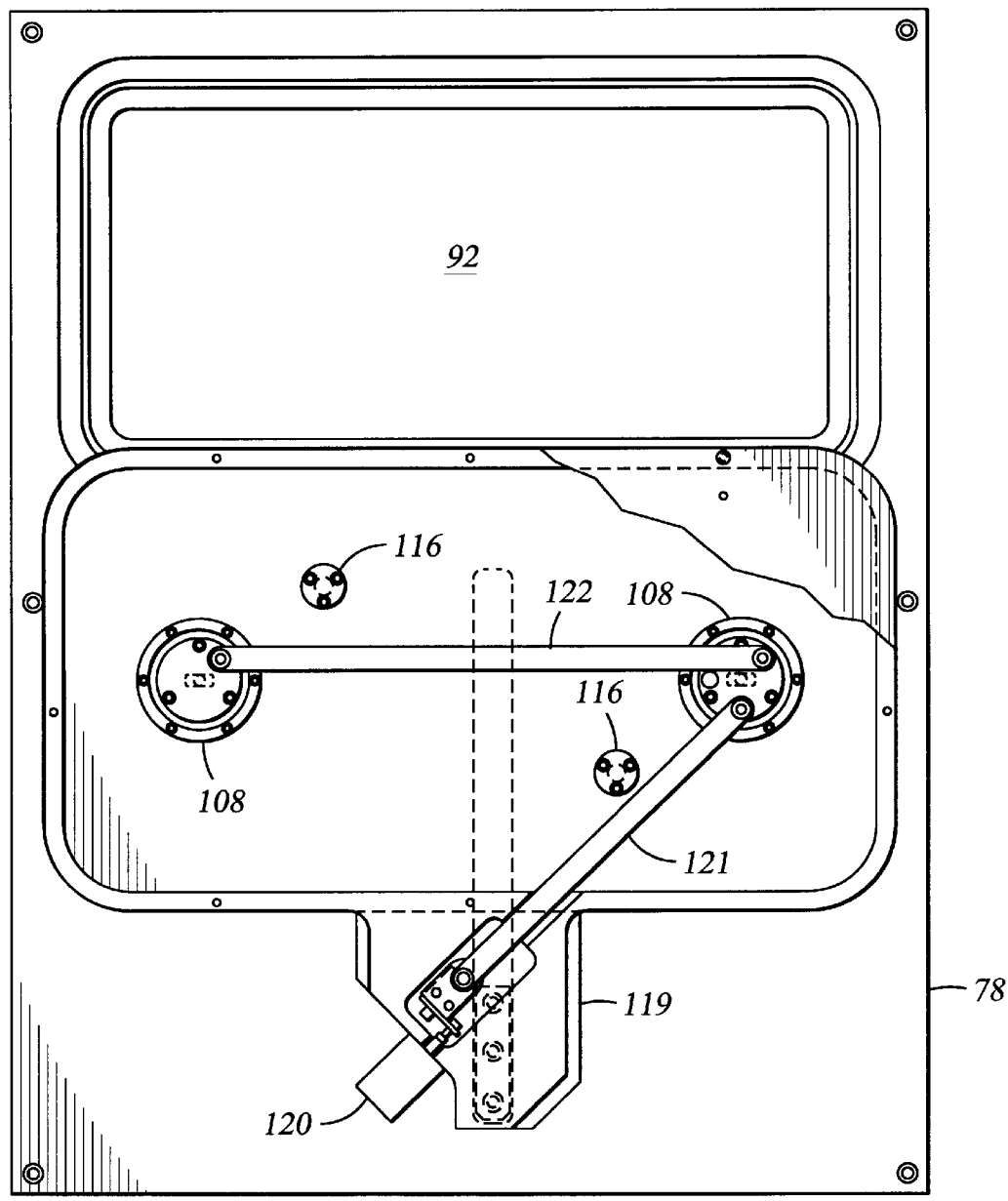
FIG. 9 is a front view of a pod door opener showing the pod door in a lowered position.

FIG. 9 is a front view of the pod door receiver and the interface plate 78 showing the pod door receiver in a lowered position. The interface plate 78 defines an opening 92 through which the wafer pod is received as the pod is moved into engagement with the pod door receiver.

By mounting the actuating mechanism for the door opener on the clean room side of the interface plate 78, the door opening envelope occupies existing space below the pod receiver. This eliminates the large gray room envelope required to operate existing pod door openers having the actuating mechanism in the gray room.

Figure 13:
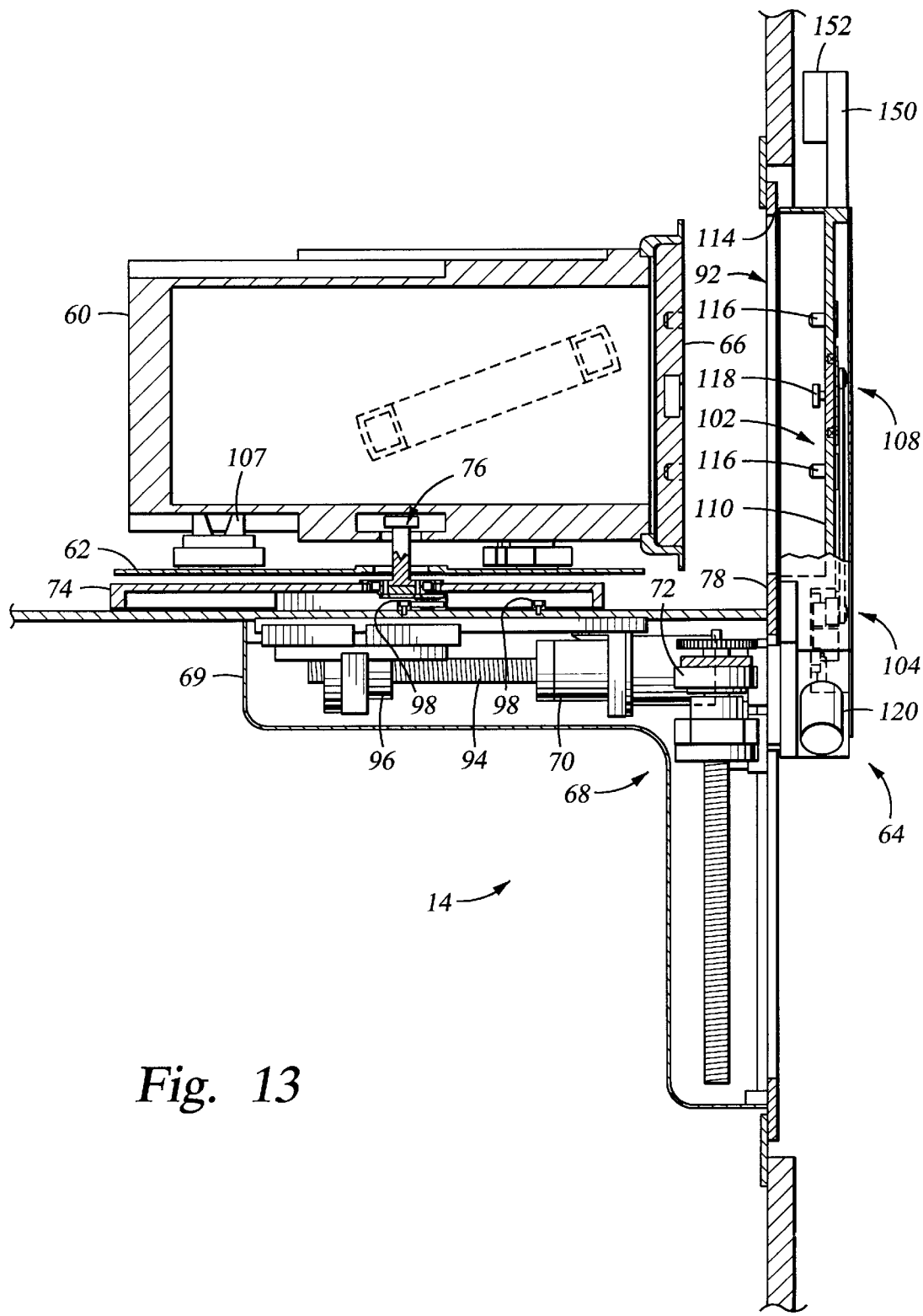
FIG. 13 is a cross sectional view of an alternative embodiment of a pod loader of the present invention.

FIG. 13 is a cross sectional view of an alternative embodiment of a door receiver having a mounting plate 150 disposed on the upper end of the pod door receiver to mount an optical sensor 152, such as a wafer mapper. As the pod door is lowered, the optical sensor can scan the wafers to determine the number of wafers, the slot position of each wafer, the orientation of each wafer in the case of misaligned wafers, as well as other known wafer mapping information. The advantages of having the optical sensors on the pod door receiver include having the sensors in closer proximity to the wafers and eliminating the need to use the robot in time consuming mapping operations.

Figure 14:
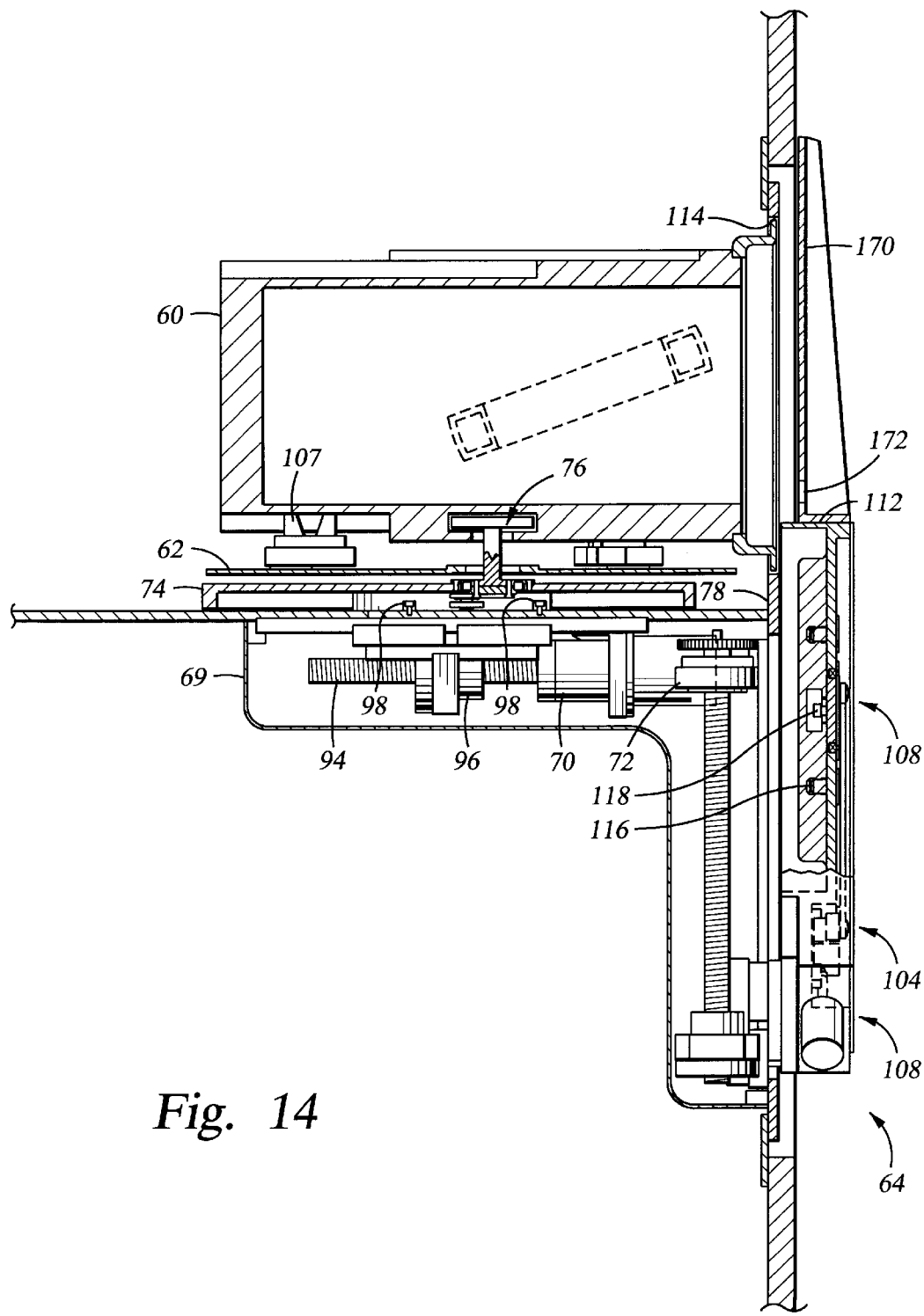
FIG. 14 is a cross sectional view of an alternative embodiment of a pod loader of the present invention.

FIG. 14 is a cross sectional view of a pod loader 14 showing an alternative embodiment of the pod door receiver 64. A secondary door 170 is disposed on the upper portion of the pod door receiver to provide additional isolation of the internal components of the wafer pod 60. A slit 172 or other opening is provided in the lower portion of the secondary door 170 to enable wafer access to and from the pod. As the pod door receiver 64 is moved downwardly, either by stepping or other actuator control, the slit 172 is located adjacent the wafer slot in the pod which requires access. This secondary door prevents open access, i.e., open exposure of the pod environment, into the wafer pod once the door is removed therefrom.

OPERATION OF THE POD LOADING STATION

Figure 10:
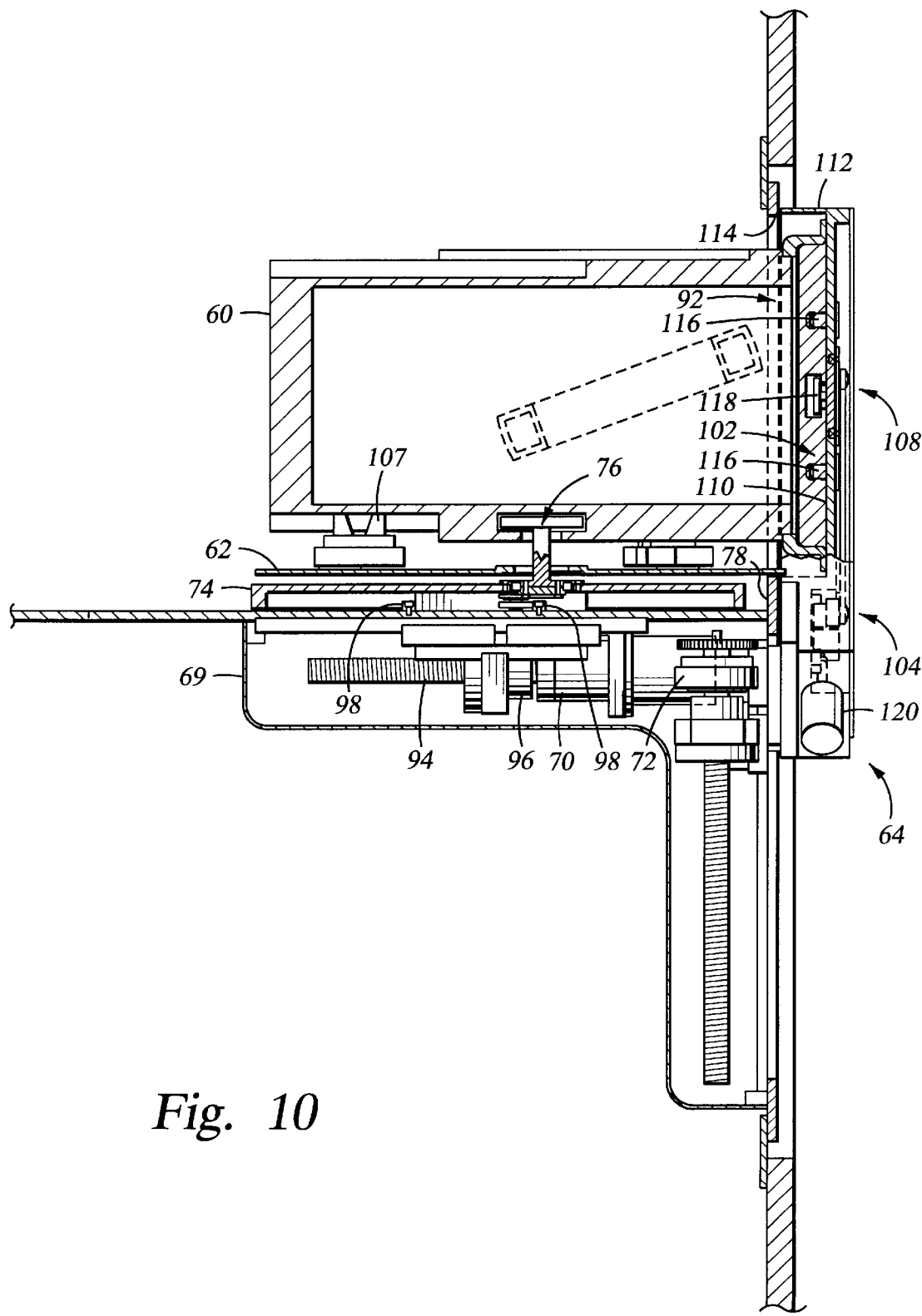
FIG. 10 is a cross sectional view of one pod loader of the present invention.
Figure 11:
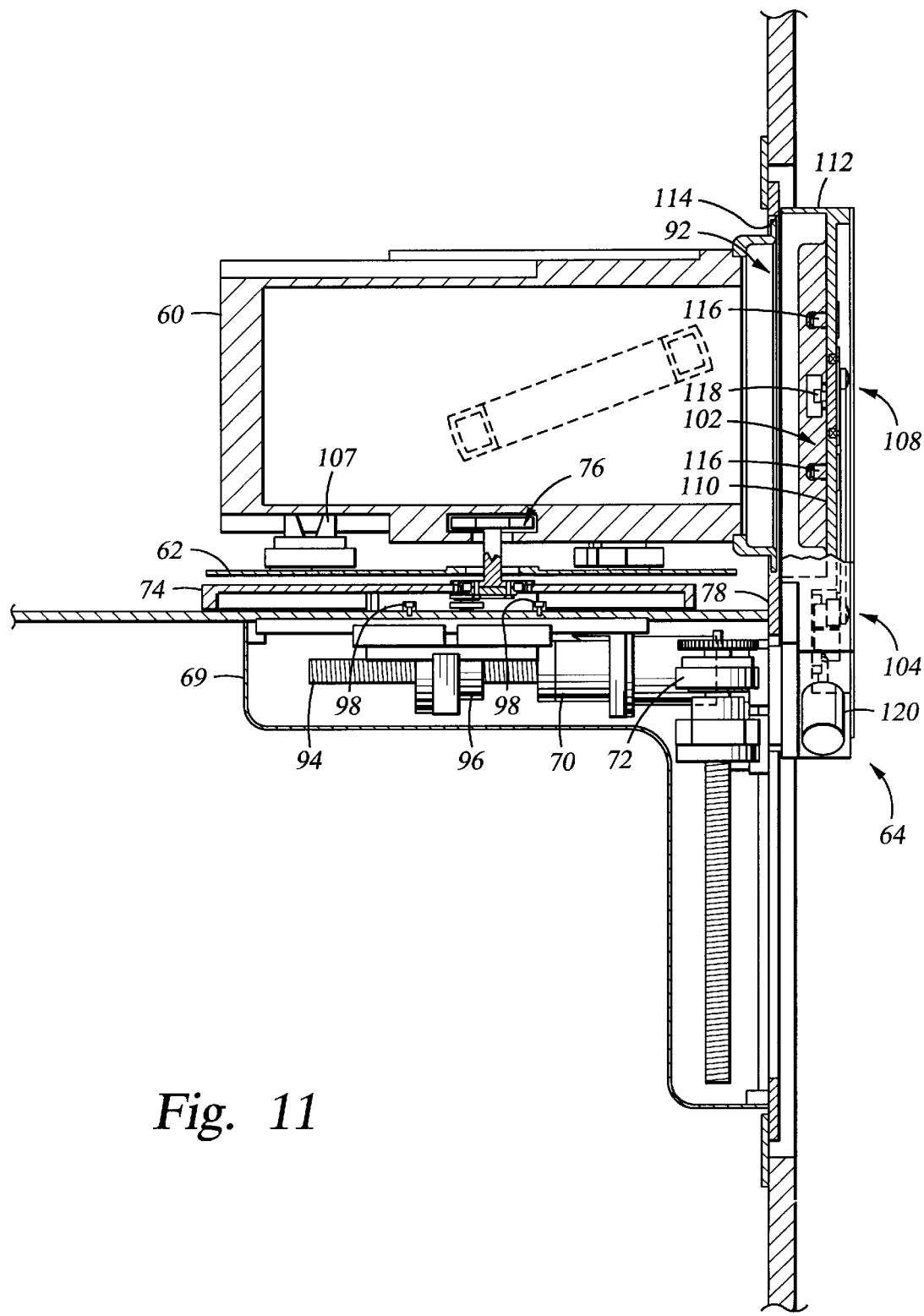
FIG. 11 is a cross sectional view of one pod loader of the present invention.
Figure 12:
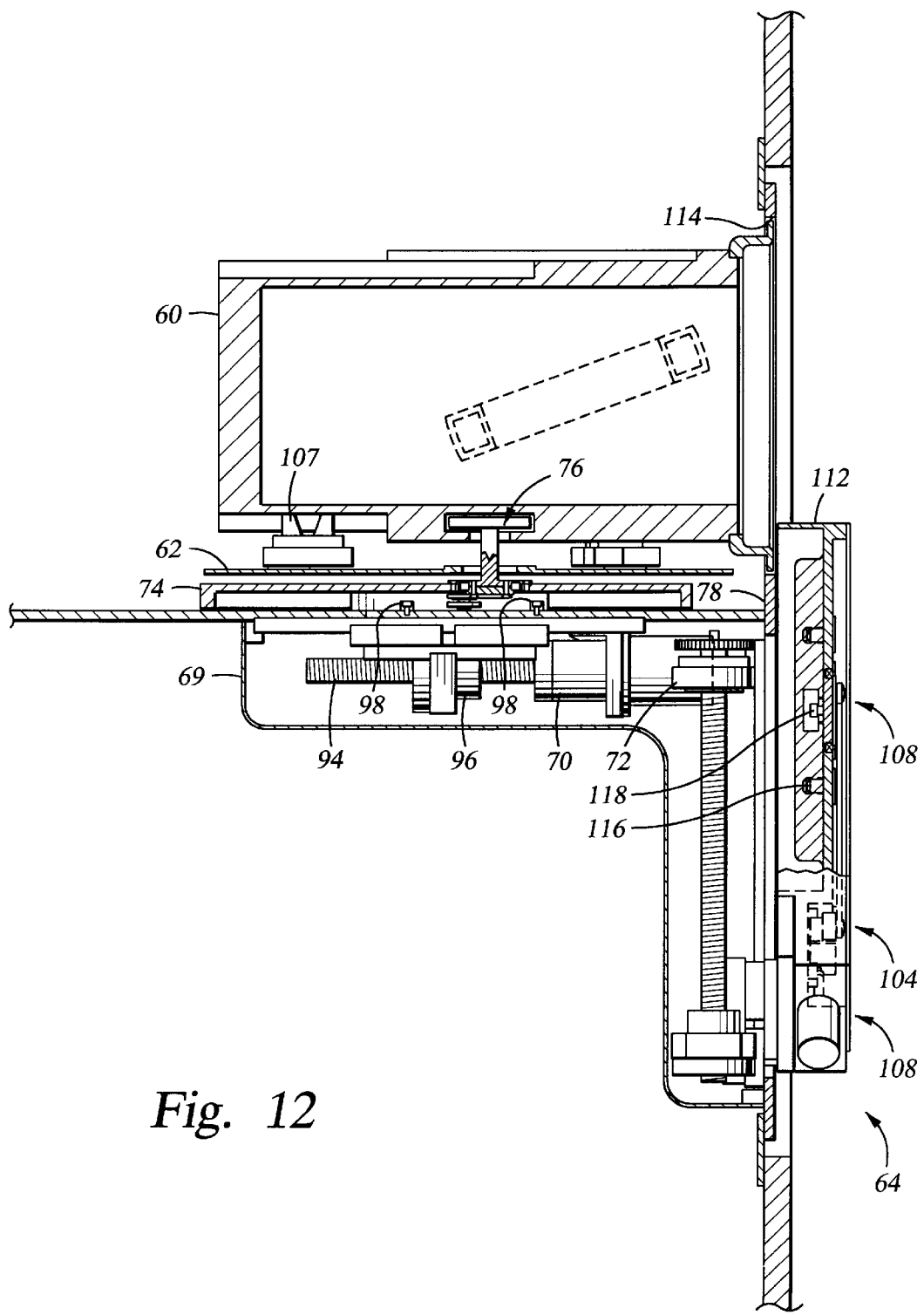
FIG. 12 is a cross sectional view of one pod loader of the present invention.

FIGS. 3, 10, 11 and 12 taken in sequence depict the operation of the pod loading station 14 once a wafer pod 60 is received thereon. Referring to FIG. 3, the wafer pod is aligned on the alignment pins 107 to insure proper positioning on movement of the pod 60 towards the interface plate 78. The receiving plate actuator 70 then moves the wafer pod towards the interface plate where the pod door 66 engages the pod door receiver 102 and latch actuating mechanisms 108 as shown in FIG. 10. As the wafer pod moves forward, the pod locking mechanism secures the wafer pod to the receiving platform 62. The alignment pins 116 on the pod door receiver 64 align the pod door as the door is received in the pod door receiver so that the latch engaging mechanisms 108 engage the pod door locks. The pneumatic actuator 120 then actuates the latch engaging mechanisms which operate the pod door latches. Once the pod door latches are opened and the pod door is unlocked, the receiving plate 62 is retracted away from the interface plate 78 to a position sufficient for the pod door to clear the pod opening as shown in FIG. 11. The outer perimeter of the wafer pod defines a narrow gap with the interface wall. A slightly positive pressure provided in the front-end staging area 12 forms a gas seal between the wafer pod and the front-end staging area 12 to prevent migration of contaminants into the front-end staging area. Once the pod door is clear from the pod opening, the vertical actuator 72 moves the door 66 and the pod door receiver 64 to a position below the opening of the pod to allow horizontal access to the pod as shown in FIG. 12. It should be recognized that the pod door is closed by reversing the steps shown in FIGS. 3 and 10–12.

The use of "pure" vertical motion to open the pod door offers several benefits. First, the "pure" vertical motion provides a more robust design in that the horizontal door motion is eliminated allowing the up-down mechanism to be a fixed mounting rather than a tilting or pull back mount typical of existing designs. Second, the envelope volume for the door opening mechanism can be located on the clean room side of the pod loading station, rather than on the gray area side of the pod loading station. This allows more freedom internal to the processing system which alleviates robotic and interference issues and will enable the processing system to take on an over-all smaller footprint. Third, an optical sensor can be incorporated as part of the door opening mechanism to enable wafer mapping with a fixed and minimum focal length, instead of a longer and/or varying focal length typical of existing designs. Fourth, the door opening mechanism can include a secondary door (as shown in FIG. 14) with a reduced size opening to minimize the possibility of contamination between the inside of the pod and the processing system environment. This secondary door can be indexed as wafers are accessed.

While foregoing is directed to the preferred embodiment of the present invention, other and further embodiments of the invention may be devised without departing from the basis scope thereof, and the scope thereof is determined by the claims that follow.

What is claimed is:

1. An apparatus for opening a pod door, comprising:
   a) a movable pod receiving member having a first actuator connected thereto and adapted to move the pod receiving member horizontally; and
   b) a pod door receiver disposed adjacent the pod receiving member, the pod door receiver having a second actuator connected thereto and adapted to move the pod door receiver vertically relative to the pod receiving member without moving the pod door receiver horizontally away from the pod receiving member.

2. The apparatus of claim 1 wherein the pod door receiver comprises a pod door latch actuating mechanism disposed thereon.

3. The apparatus of claim 2 wherein the pod receiving member further comprises a locking mechanism to secure a wafer pod thereto.

4. The apparatus of claim 3 wherein the first and second actuators are electric or pneumatic motors.

5. The apparatus of claim 4 wherein the pod door latch actuating mechanism comprises two rotatable members actuated by at least a third actuator.

6. The apparatus of claim 5 wherein the at least one actuator is mounted on the pod door receiver.

7. The apparatus of claim 1 wherein the pod door receiver comprises a recess adapted to receive a pod door, the recess comprising one or more pod door latch actuating mechanisms disposed thereon.

8. The apparatus of claim 7 wherein the recess further comprises one or more pod door alignment pins disposed thereon.

9. The apparatus of claim 1 further comprising:
   c) a base plate to mount the pod receiving member and the first actuator; and
   d) an interface plate connected to the base plate, the interface plate defining an opening through which a wafer can be transferred.

10. The apparatus of claim 9 wherein the pod door receiver and the interface plate define a gap adjacent the opening when the pod door receiver is in at least one position.

11. The apparatus of claim 9 wherein the interface plate and the perimeter of a wafer pod opening define a gap adjacent the interface opening when the pod door receiver is in a wafer transfer position.

12. An apparatus for processing wafers, comprising:
   a) a front-end staging area having one or more pod loading stations disposed thereon, the pod loading stations comprising:
      1) a movable pod receiving member having an actuator connected thereto and adapted to move the pod receiving member between at least a first loading/unloading position, a second pod door engaging position and a third pod door removal position; and
      2) a pod door receiver disposed adjacent the pod receiving member, the pod door receiver having an actuator connected thereto and adapted to move the pod door receiver relative to the pod receiving member without moving the pod door receiver horizontally away from the pod receiving member;
   b) one or more load lock chambers connected to the front-end staging area;
   c) a transfer chamber connected to the one or more load lock chambers; and
   d) one or more processing chambers connected to the transfer chamber.

13. The apparatus of claim 12 further comprising a base plate to mount the pod receiving member and the actuator and an interface plate connected to the base plate, the interface plate defining an opening through which the wafers are transferred.

14. The apparatus of claim 13 wherein the pod door receiver and the interface plate define a gap adjacent the opening when the pod door receiver is in a door receiving position.

15. The apparatus of claim 13 wherein the interface plate and the perimeter of a wafer pod opening define a gap adjacent the interface opening when the pod door receiver is in a wafer transfer position.

16. The apparatus of claim 13 wherein the front-end staging area is maintained at a slightly positive pressure.

17. A method of operating a pod door disposed in a pod opening, comprising:
   a) moving a wafer pod to engage the pod door with a door opening member;
   b) retracting the wafer pod to disengage the pod door from the pod opening; and
   c) moving the pod door out of the pod door opening.

18. The method of claim 17 wherein the step of moving the pod door out of the pod door opening comprises lowering the pod door below the pod opening.

19. The method of claim 18 further comprising unlocking the pod door from the pod opening following engagement with the door opening member.

20. The method of claim 19 wherein the wafer pod is moved from a first loading position to a second door opener engaging position and then to an intermediate door removal position.

21. The method of claim 18 wherein the pod door is supported in a recess in the door opener.

22. The method of claim 17 further wherein the door opener comprises an optical sensor to map one or more wafers disposed in the wafer pod.

23. An apparatus for opening a pod door, comprising:
   a) a movable pod receiving member having a first actuator connected thereto and adapted to move the pod receiving member between at least a first, a second and a third position; and
   b) a pod door receiver disposed adjacent the pod receiving member, the pod door receiver having a second actuator connected thereto and adapted to move the pod door receiver relative to the pod receiving member, and having a recess adapted to receive a pod door, the recess comprising one or more pod door latch actuated mechanisms disposed thereon.

24. The apparatus of claim 23 wherein the recess further comprises one or more pod door alignment pins disposed thereon.

25. An apparatus for opening a pod door, comprising:
   a movable pod receiving member having a first actuator connected thereto and adapted to move the pod receiving member between at least a first, second and third position;
   a pod door receiver disposed adjacent the pod receiving member, the pod door receiver having a second actuator connected thereto and adapted to move the pod door receiver relative to the pod receiving member;
   a base plate to which the pod receiving member and the first actuator are mounted; and
   an interface plate connected to the base plate, the interface plate defining an opening through which a wafer can be transferred;

wherein the interface plate and a perimeter of a wafer pod opening define a gap adjacent the interface opening when the pod door receiver is in a wafer transfer position.

26. An apparatus for processing wafers, comprising:
  a) a front-end staging area having one or more pod loading stations disposed thereon, the pod loading stations comprising:
   1) a movable pod receiving member having an actuator connected thereto and adapted to move the pod receiving member between at least a first loading/unloading position, a second pod door engaging position and a third pod door removal position; and
   2) a pod door receiver disposed adjacent the pod receiving member, the pod door receiver having an actuator connected thereto and adapted to move the pod door receiver relative to the pod receiving member;
   3) a base plate to mount the pod receiving member and the actuator; and
   4) an interface plate connected to the base plate, the interface plate defining an opening through which the wafers are transferred;
    wherein the interface plate and the perimeter of a wafer pod opening define a gap adjacent the interface opening when the pod door receiver is in a wafer transfer position;
  b) one or more load lock chambers connected to the front-end staging area;
  c) a transfer chamber connected to the one or more load lock chambers;
  d) one or more processing chambers connected to the transfer chamber.

* * * * *